United States Patent [19]

Shikatani et al.

[11] Patent Number: 5,341,383
[45] Date of Patent: Aug. 23, 1994

[54] CIRCUIT ARRANGEMENT SUITABLE FOR TESTING CELLS ARRANGED IN ROWS AND COLUMNS, SEMICONDUCTOR INTEGRATED CIRCUIT DEVICE HAVING THE SAME, AND METHOD FOR ARRANGING CIRCUIT BLOCKS ON CHIP

[75] Inventors: Junichi Shikatani, Toyonaka; Shigeki Kawahara, Kawasaki, Japan

[73] Assignee: Fujitsu Limited, Kanagawa, Japan

[21] Appl. No.: 736,999

[22] Filed: Jul. 29, 1991

[30] Foreign Application Priority Data

Jul. 30, 1990 [JP] Japan ................................. 2-202263

[51] Int. Cl.$^5$ ............................................. G01R 31/28
[52] U.S. Cl. .................................. 371/22.1; 371/22.3
[58] Field of Search ................. 371/22.2, 22.1, 22.3, 371/22.5; 307/465.1, 443, 465

[56] References Cited

U.S. PATENT DOCUMENTS

| | | | |
|---|---|---|---|
| 4,710,930 | 12/1987 | Hatayama et al. | 371/22.3 |
| 4,710,931 | 12/1987 | Bellay et al. | 371/22.3 |
| 4,739,250 | 4/1988 | Tanizawa | 371/22.2 |
| 4,914,379 | 4/1990 | Maeno | 371/22.3 |
| 4,972,372 | 11/1990 | Ueno | 371/22.2 |
| 5,043,986 | 8/1991 | Agrawal | 371/22.5 |
| 5,121,394 | 6/1992 | Russell | 371/22.1 |
| 5,172,377 | 12/1992 | Robinson et al. | 371/22.3 |
| 5,173,904 | 12/1992 | Daniels et al. | 371/22.3 |
| 5,184,067 | 2/1993 | Nozuyama | 371/22.2 |

FOREIGN PATENT DOCUMENTS

| | | |
|---|---|---|
| 0174236A1 | 3/1986 | European Pat. Off. . |
| 0285311A3 | 10/1988 | European Pat. Off. . |
| 0308503A1 | 3/1989 | European Pat. Off. . |
| 119953 | of 1987 | Japan . |

OTHER PUBLICATIONS

Proc. of the IEEE 1990 Custom Integrated Circuits Conference, May '90, Boston US, pp. 411-414; K. Pierce et al.: "High Performance CMOS Array With an Embedded Test Structure".

Proc. of the IEEE 1989 Custom Integrated Circuits Conference, May '89, San Diego, US, pp. 331-334; C. Ng et al.: "A Herarchical Floor-Planning, Placement, and Routing Tool for Sea-of-Gates Designs".

Primary Examiner—Kevin J. Teska
Attorney, Agent, or Firm—Nikaido, Marmelstein, Murray & Oram

[57] ABSTRACT

A circuit arrangement formed on an IC chip includes a first type block and a second type block. The first type block has a plurality of cells arranged into rows and columns and a plurality of transistors respectively provided for the cells. Each of the transistors has a first terminal coupled to a corresponding one of the cells, a second terminal and a gate terminal. The second type block is a block which is not required to be test in a way identical to that for the first type block. A probe line driver tests the cells in the first type block, and is located along a first edge of the first type block. A plurality of probe lines extend from the probe line driver and run in the first type block. Each of the probe lines is connected to the gate of a corresponding one of the transistors. A sense circuit senses data read out from the cells via a plurality of sense lines running in the first type block. Each of the sense lines is connected to the second terminal of a corresponding one of the transistors. The sense circuit is located along a second edge of the first type block substantially perpendicular to the first edge of the first type block. A test control circuit controls the probe line driver and the sense circuit so that data are successively read out from the cells and transferred to the sense lines via the transistors. The test control circuit is adjacent to the probe line driver and the sense circuit.

32 Claims, 14 Drawing Sheets

CIRCUIT ARRANGEMENT SUITABLE FOR TESTING CELLS ARRANGED IN ROWS AND COLUMNS, SEMICONDUCTOR INTEGRATED CIRCUIT DEVICE HAVING THE SAME, AND METHOD FOR ARRANGING CIRCUIT BLOCKS ON CHIP

BACKGROUND OF THE INVENTION

1. Field of the Invention

The present invention generally relates to semiconductor integrated circuit devices, and more particularly to a circuit arrangement suitable for testing cells arranged in rows and columns in a matrix test block which is formed, together with a non-test block, on an IC chip.

2. Description of the Prior Art

There is known a semiconductor integrated circuit devices having a plurality of logic cells which are coupled via interconnection lines to thereby provide desired logic circuits. Such a semiconductor integrated circuit device is called a logic LSI device. Examples of the logic LSI device are a gate array device, a standard cell array device and a master-slice type integrated circuit device.

The recent advance of fabricating logic LSIs provides a drastically increased number of logic cells arranged in one chip. Currently, logic LSIs having tens to hundreds of thousands of logic cells are available. As an increased number of logic cells is used, an increased number of test patterns must be provided for testing logic LSIs. It takes a long time to produce such test patterns and it is very difficult to determine whether or not desired logic structures are realized correctly. From these points of view, there is a strong need to develop semiconductor integrated circuit devices having built-in test circuits capable of easily verifying logic structures formed therein.

Japanese Laid-Open Patent Application NO. 61-42934 proposes a semiconductor integrated circuit device having a built-in test circuit. FIGS. 1A-1B are a block diagram of the proposed semiconductor integrated circuit device. Referring to this figure, input-/output (I/O) areas 2a, 2b, 2c and 2d are provided in peripheral surface portions of a semiconductor chip 1. A plurality of cells (gates) are arranged in a matrix of rows and columns in an inner area surrounded by the I/O areas 2a, 2b, 2c and 2d. These cells are interconnected in accordance with a logic design so that desired logic circuits can be formed.

In order to test the cells, the following arrangements are provided. A plurality of probe lines 3 run at predetermined intervals in a direction in which columns of cells are formed. A plurality of sense lines 4 run at predetermined intervals in a direction in which rows of cells run. A switching transistor 5 is provided at each cross point of the probe lines 3 and the sense lines 4. A logic cell, such as a NAND gate, an AND gate, an OR gate or a NOT gate, is coupled to the corresponding sense line 4 via the transistor 5, the gate terminal of which is connected to the corresponding probe line 3.

A probe line driver 6 for successively selecting one of the probe lines 3 is formed along the I/O area 2c on the left side of the chip 1. A sense amplifier 7 for successively selecting one of the sense lines 4 is formed along the I/O area 2d on the lower side of the chip 1. Further, a test control circuit 8 for controlling the probe line driver 6 and the sense amplifier 7 is provided at a corner of the inner area close to the probe line driver 6 and the sense circuit 7. The test control circuit 8 provides the probe line driver 6 with necessary data for selection as well as a clock signal, in synchronism with which the probe lines 3 are successively selected one by one from the top thereof. When one of the probe lines 3 is turned ON, all transistors 5 coupled to the selected probe line 3 is turned ON, so that the outputs (data) of all cells coupled to the selected transistors 5 are read out to the sense lines 4.

Meanwhile, the sense circuit 7 receives a clock signal from the test control circuit 8 and selects all the sense lines 4 one by one during the time one of the probe lines 3 is being selected. The readout data (information about the potential of the output of the cell) are successively output to an external device via a corresponding I/O pad formed in the I/O area 2a. Alternatively, it is possible to select all the probe lines 3 one by one while one of the select lines 4 is being selected.

With the above-mentioned test, which is called a matrix test, it becomes possible to directly test each cell. It will be noted that conventional test procedures other than the matrix test cannot test each cell but can test the internal circuits in the flip-flop unit. The matrix probing test is also disclosed in U.S. Pat. No. 4,739,250 or U.S. Pat. No. 5,149,993, the disclosure of which is hereby incorporated.

The above-mentioned matrix test is suitable for circuit blocks in which the probe lines 3 and the sense lines 4 are allowed to be arranged in rows and columns. On the other hand, the matrix test is not suitable for circuit blocks of macrocells, such as random access memories, read only memories or central processing units, because they have very complex layout patterns. That is, it is very impossible to arrange the probe lines 3 and the sense lines 4 in rows and columns in the already designed layout patterns. It may be possible to redesign RAMs, ROMs or CPUs having the probe lines 3 and the sense lines 4 without using the already designed layout patterns (resources). However, this is not an efficient procedure since the available resources of layout patterns are not utilized.

Meanwhile, it is possible to fabricate "hybrid" semiconductor integrated circuit chips having matrix test blocks and non-test blocks. The matrix test blocks are blocks which are tested by the matrix test, and the non-test blocks are blocks which are not suitable for the matrix test, such as RAMs, ROMs and CPUs. If the probe lines 3 and the sense lines 4 are provided for such IC chips on the basis of the configuration shown in FIGS. 1A-1B, these lines will be arranged as shown in FIG. 2, in which those parts which are the same as those shown in FIGS. 1A-1B are given the same reference numerals. A matrix test block 10 and a non-test block 9 are arranged, as shown in FIG. 2. The probe line driver 6 runs along the I/O area 2c, and the sense circuit runs along the I/O area 2d. It is actually impossible to arrange the probe lines and the sense lines in the already designed non-test block 10. As a result, it is impossible to test all cells in the matrix test block 9. It may be possible to redesign the non-test block 10 suitable for the matrix test. However, this does not utilize the available resources of layout patterns and needs an extremely large amount of time and an extremely high cost.

SUMMARY OF THE INVENTION

It is a general object of the present invention to provide an improved circuit arrangement in which the above-mentioned disadvantages are eliminated.

A more specific object of the present invention is to provide a circuit arrangement which makes it possible to test all cells in the matrix test blocks without changing the already designed layout patterns of the non-test blocks.

These objects of the present invention are achieved by a circuit arrangement formed on an IC chip comprising:

a first type block having a plurality of cells arranged into rows and columns and a plurality of transistors respectively provided for the cells, each of the transistors having a first terminal coupled to a corresponding one of the cells, a second terminal and a gate terminal;

a second type block which is not required to be tested in a way identical to that for the first type block;

a probe line driver testing the cells in the first type block, the probe line driver being located along a first edge of the first type block, a plurality of probe lines extending from the probe line driver and running in the first type block, each of the probe lines being connected to the gate of a corresponding one of the transistors;

a sense circuit sensing data read out from the cells via a plurality of sense lines running in the first type block, each of the sense lines being connected to the second terminal of a corresponding one of the transistors, the sense circuit being located along a second edge of the first type block substantially perpendicular to the first edge of the first type block; and a test driver circuit controlling the probe line driver and the sense circuit so that data are successively read out from the cells and transferred to the sense lines via the transistors, the test control circuit being adjacent to the probe line driver and the sense circuit.

The above-mentioned objects of the present invention are also achieved by a circuit arrangement formed on an IC chip comprising:

a plurality of first type blocks, each having a plurality of cells arranged into rows and columns and a plurality of transistors respectively provided for the cells, each of the transistors having a first terminal coupled to a corresponding one of the cells, a second terminal and a gate terminal;

a second type block which is not required to be tested in a way identical to that for the first type blocks;

probe line drivers respectively provided for the first type blocks, each of the probe line drivers testing the cells in a corresponding one of the first type blocks, each of the probe line drivers being located along a first edge of the corresponding first type block, a plurality of probe lines extending from the probe line driver and running in the corresponding first type block, each of the probe lines being connected to the gate of a corresponding one of the transistors;

sense circuits respectively provided for the first type blocks, the sense circuit sensing data read out from the cells via a plurality of sense lines running in the corresponding first type block, each of the sense lines being connected to the second terminal of a corresponding one of the transistors, each of the sense circuits being located along a second edge of the corresponding first type block substantially perpendicular to the first edge thereof; and test driver circuits respectively provided for the first type blocks, the test driver circuits controlling the probe line drivers and the sense circuits so that data are successively read out from the cells and transferred to the sense lines via the transistors, each of the driver circuits being adjacent to a corresponding one of the probe line drivers and a corresponding one of the sense circuits.

Another object of the present invention is to provide a semiconductor integrated circuit device comprising;

a chip;

a plurality of circuit blocks formed on the chip, each of the circuit blocks comprising a plurality of circuit nodes, a plurality of sense lines coupled to the circuit nodes via a plurality of switches, and a plurality of probe lines crossing the sense lines and controlling the switches; and a plurality of test control circuits, each being provided for a corresponding one of the circuit blocks and arranged along two neighboring edges of the corresponding circuit block, each of the test control circuits testing the circuit nodes of the corresponding circuit block, each of the test control circuits comprising a sense circuit selectively selecting the sense lines of the corresponding circuit block, and a drive circuit selecting the probe lines of the corresponding circuit block.

Yet another object of the present invention is to provide a method for arranging circuit blocks on a chip, the method comprising the steps of:

categorizing the circuit blocks to be arranged on the chip into a first group required to test the circuit blocks by a matrix probing test and a second group which is not required to test the circuit blocks by the matrix probing test;

dividing each circuit blocks in the first group into sub-blocks, each having a substantially rectangular area on the chip;

arranging a plurality of sense lines and probe lines in each of the sub-blocks; and arranging a test control circuit along two edges of each of the sub-blocks, the test control circuit being connected to the sense lines and probe lines and testing a corresponding one of the sub-blocks by the matrix probing test.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1B:
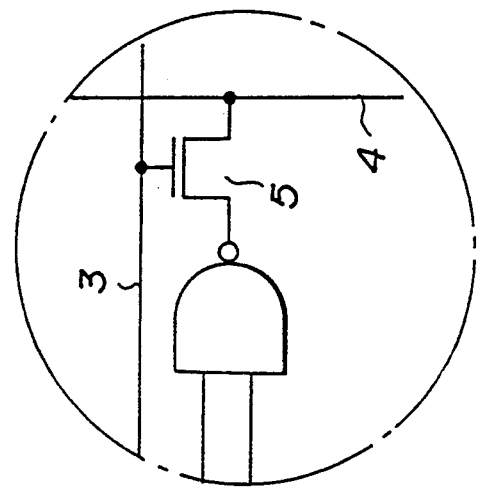
FIGS. 1A and 1B are a block diagram of a conventional semiconductor integrated circuit chip having a matrix test circuit based on the matrix.
Figure 1A:
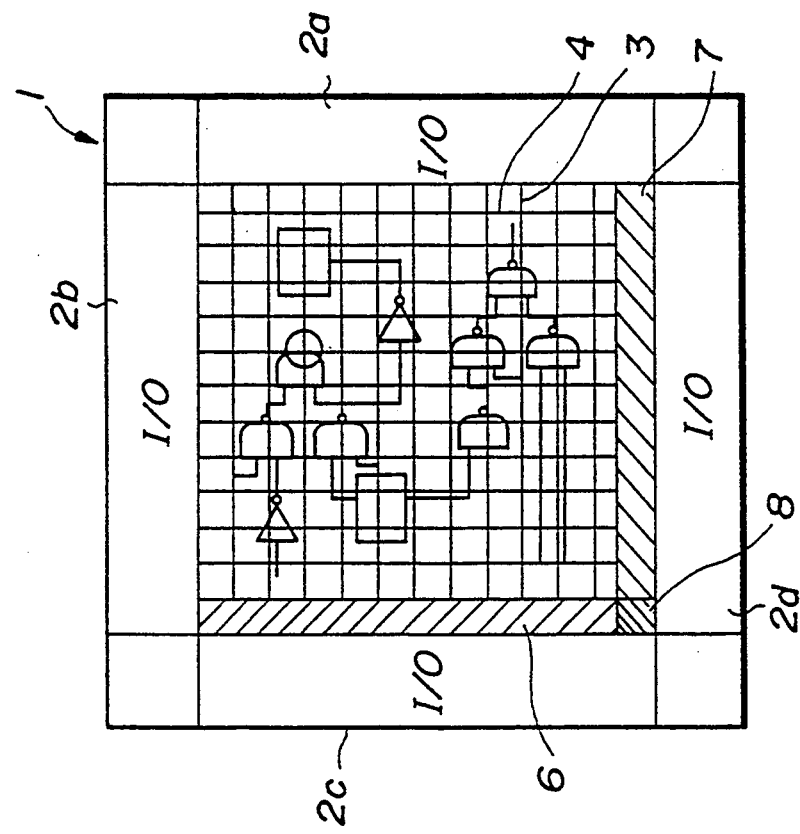
Figure 2:
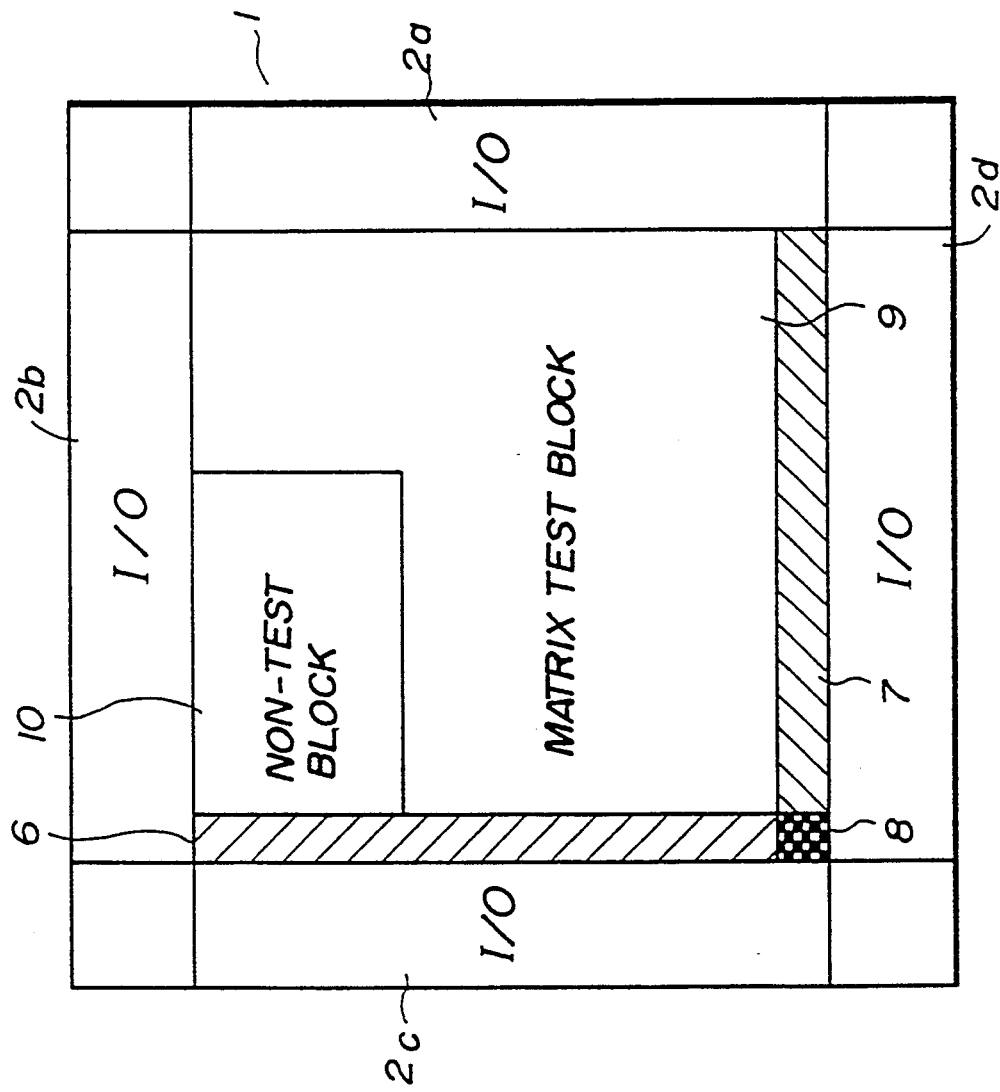
FIG. 2 is a block diagram of a conceivable circuit arrangement of the matrix test circuit formed in a hybrid semiconductor IC chip having matrix test blocks and non-test blocks.
Figure 3:
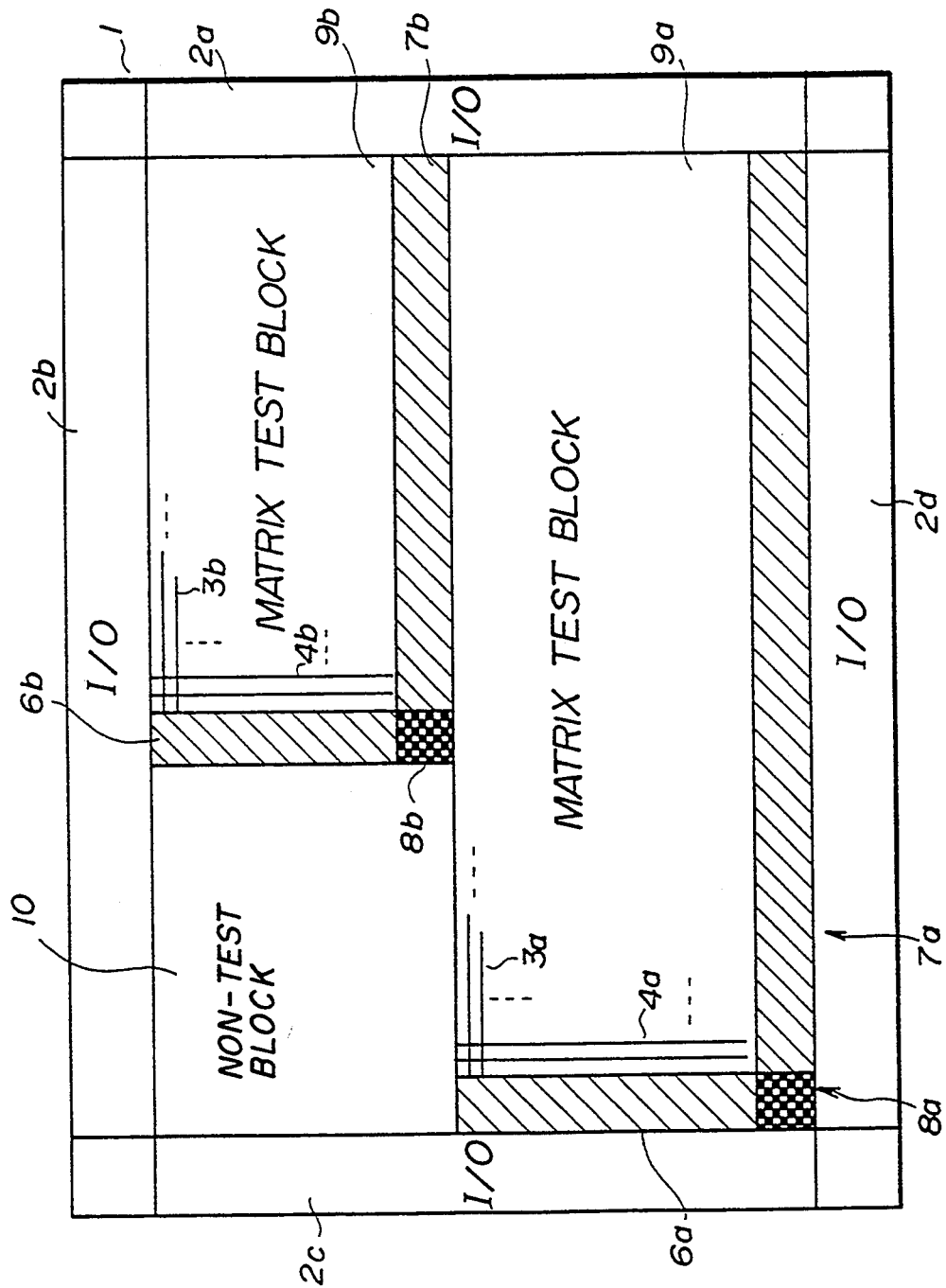
FIG. 3 is a diagram showing a circuit arrangement according to a first preferred embodiment of the present invention.

FIG. 3 shows an arrangement on a chip according to a first preferred embodiment of the present invention. In FIG. 3, those parts which are the same as those shown in the previously described figures are given the same reference numerals. Two matrix test blocks 9a and 9b, and a non-test block 10 are arranged on the chip 1. The matrix test blocks 9a and 9b are obtained by dividing the matrix test block 9 shown in FIG. 2 into blocks, each having a substantially rectangular area. The matrix test blocks 9a and 9b have, for example, standard cell structures when the chip 1 is a standard cell type integrated circuit chip.

A probe line driver 6a and a sense circuit 7a, which are provided for testing the matrix test block 9a, are located along respective edges of the matrix test block 9a. A test control circuit 8a is provided in the vicinity of the probe line driver 6a and the sense circuit 7a. A plurality of probe lines 3a extending from the probe line driver 6a run in the row direction. The probe line driver 6a is adjacent to the I/O area 2c. A plurality of sense lines 4a extending from the sense circuit 7a run in the column direction. The sense circuit 7a is adjacent to the I/O area 2d. Similarly, a probe line driver 6b and a sense circuit 7b, which are provided for testing the matrix test block 9b, are located along respective edges of the matrix test block 9b. The probe line driver 6b is adjacent to the non-test block 10. A test control circuit 8b is provided in the vicinity of the probe line driver 6b and the sense circuit 7b. The test control circuit 8b is adjacent to the matrix test block 9a. A plurality of probe lines 3b extending from the probe line driver 6b run in the row direction. A plurality of sense lines 4b extending from the sense circuit 7b run in the column direction. With the above-mentioned arrangement, it becomes possible to test all the cells in the matrix test blocks 9a and 9b by the matrix test procedure.

Figure 4:
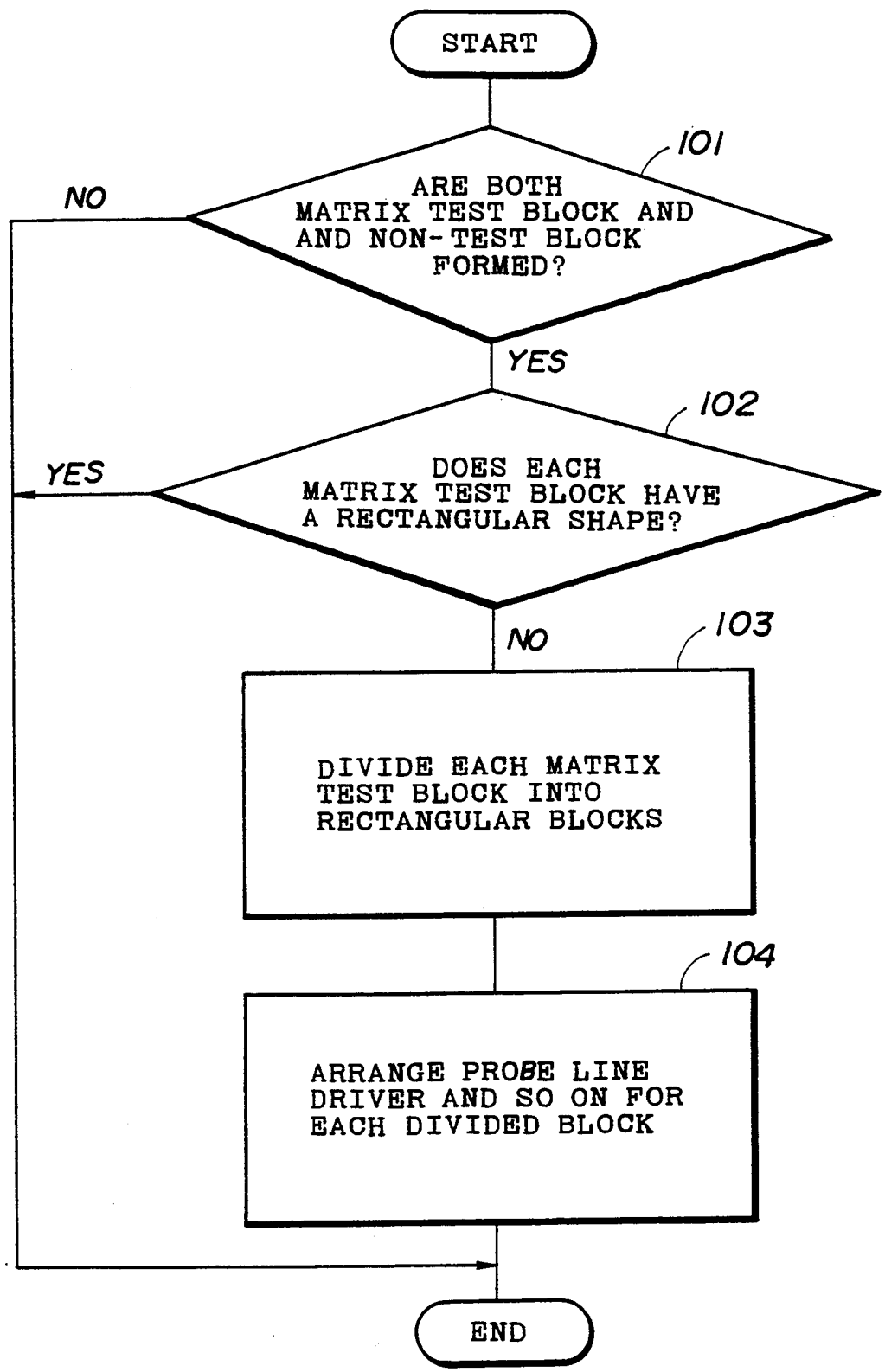
FIG. 4 is a flowchart of a procedure for dividing a matrix test block into rectangular blocks.

FIG. 4 is a flowchart of a procedure for determining the layout of the chip including a matrix test block and a non-test block. At step 101, it is determined whether or not at least one matrix test block and at least one non-test block are included in a chip of concern. When the result at step 101 is NO, the procedure ends. On the other hand, when the result at step 101 is YES, it is determined, at step 102, whether or not each matrix test block has a rectangular area. When the result at step 102 is YES, the procedure ends. On the other hand, when the result at step 102 is NO, it is determined, at step 103, whether or not each block which is determined as a non-rectangular area is divided into a plurality of rectangular-shaped circuit blocks. At step 104, one probe line driver, one sense circuit and one test control circuit are provided for each of the rectangular-shaped circuit blocks. Each block determined to be NO and YES at steps 101 and 102, respectively is subjected to the same procedure as that at step 104.

Figure 5:
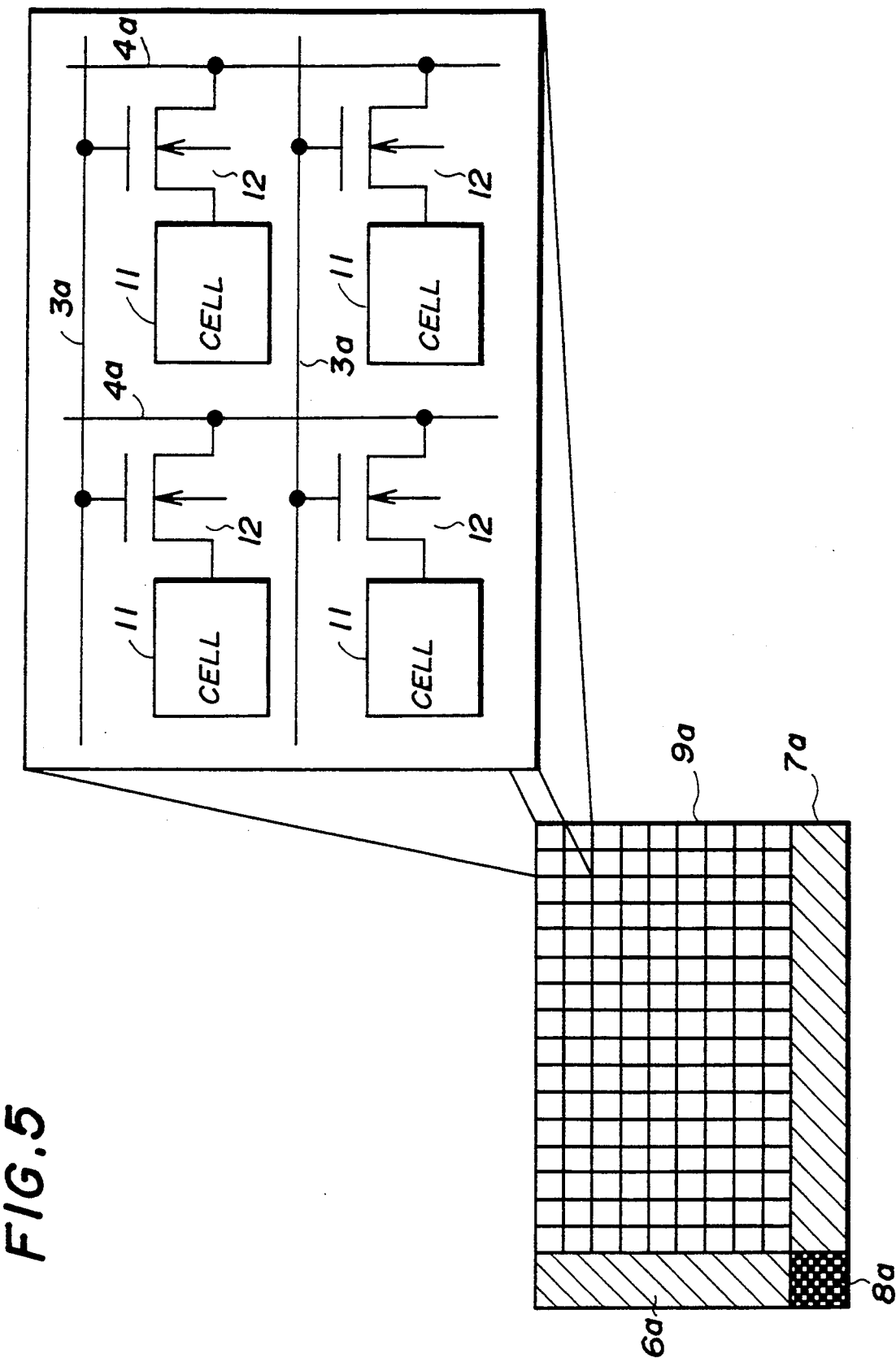
FIG. 5 is a block diagram showing cells and read (transfer) transistors arranged into rows and columns in a matrix test block.

FIG. 5 shows a read system provided in the matrix test block 9a shown in FIG. 3. The matrix test block 9 has a plurality of cells 11 arranged in rows and columns. The cells 11 are formed of, for example, basic cells in the master-slice type circuit device. Each of the cells 11 is connected, via a corresponding switching transistor 12, to the corresponding sense line 4a extending from the sense circuit 7a. Each transistor 12 is, for example, an N-channel field effect transistor, such as a MOS transistor. The gate of each of the transistors 12 is connected to the corresponding probe line 3a extending from the probe line driver 6a. The matrix test block 9b is configured in the same way as the matrix test block 9a.

Figure 6:
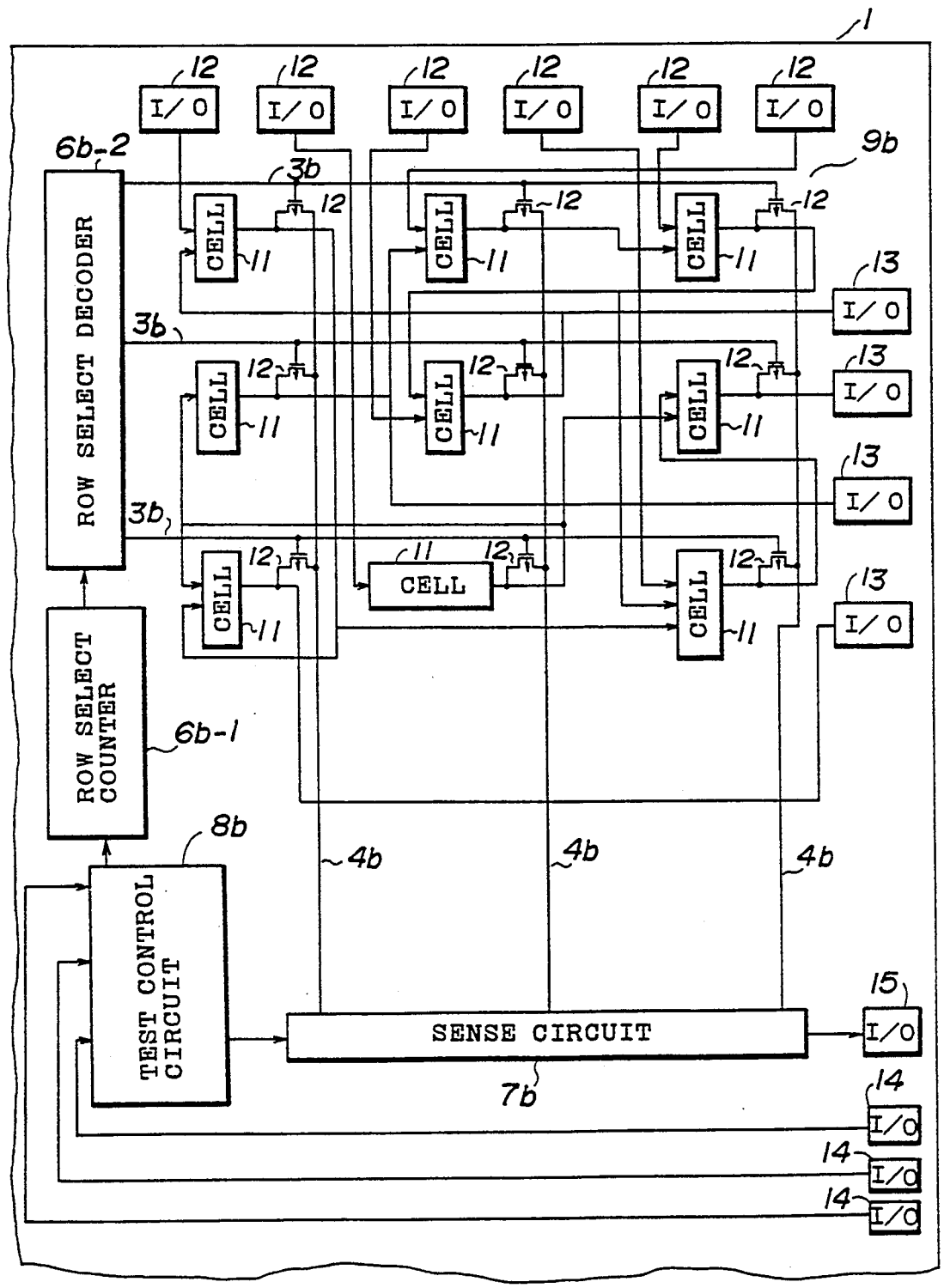
FIG. 6 is a diagram showing the matrix test block in detail.

FIG. 6 shows the matrix test block 9b, the probe line driver 6b, the sense circuit 7b and the test control circuit 8b shown in FIG. 3 in detail. Pads 12 connected to the input sides of the cells 11 are aligned in the I/O area 2b, and pads 13 connected to the output sides of the cells 11 are aligned to the I/O area 2a. A plurality of cells 11, transistors 12, probe lines 3b and sense lines 4b are provided in the matrix test block 9b. The probe line driver 6b is composed of a row select counter 6b-1 and a row select decoder 6b-2. The sense circuit 7b is formed of a shift register or a combination of a shift register and a data compression circuit, as will be described later. Readout data transferred via the sense lines 4b are output to an I/O pad 15 provided in the I/O area 2a. The test control circuit 8b receives a clock signal, a control signal and a data signal via I/O pads 14 in the I/O area 2a, and outputs clock signals respectively supplied to the row select counter 6b-1 and the sense circuit 7b.

Figure 7:
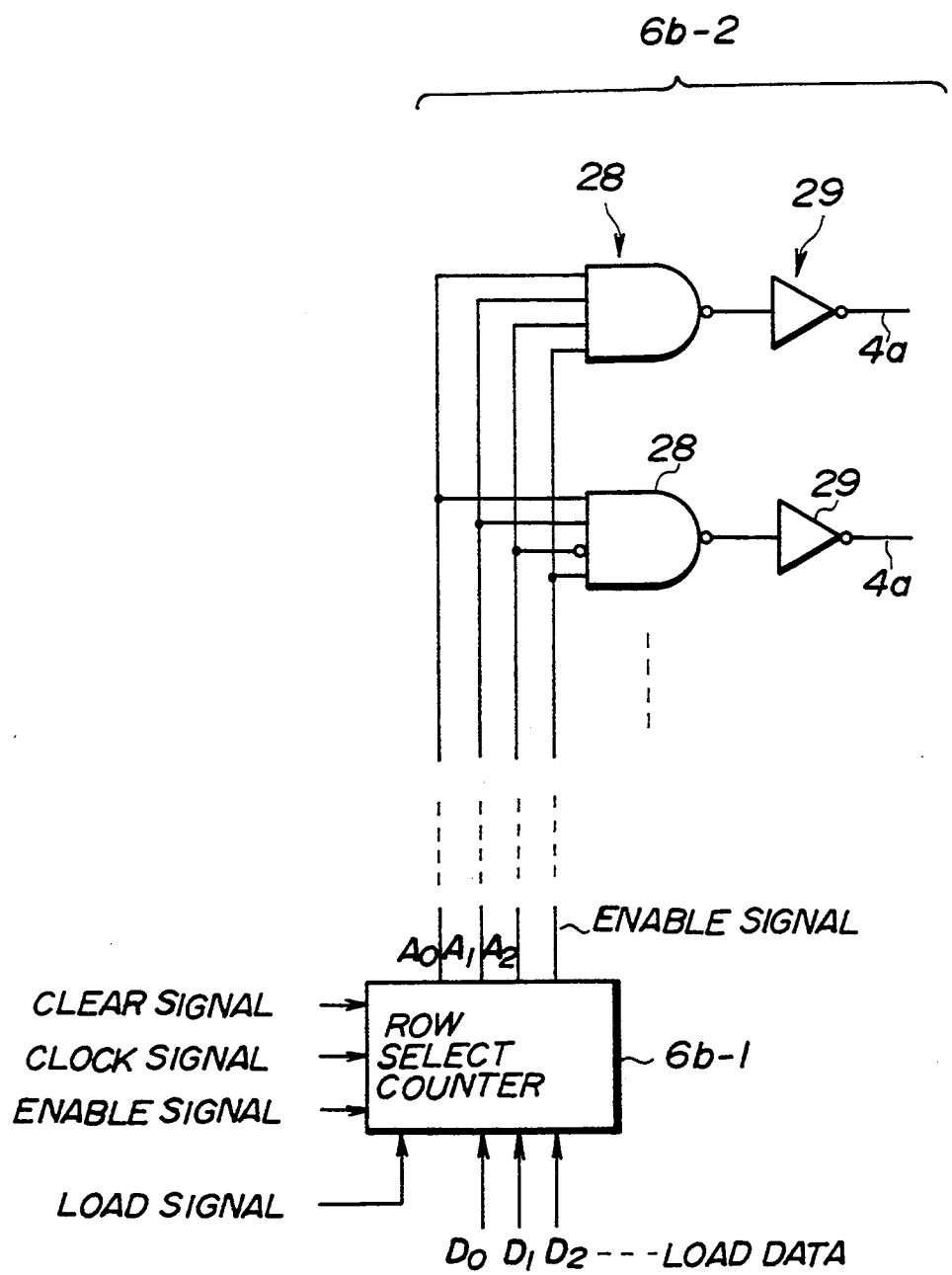
FIG. 7 is a block diagram of a probe line driver.

Referring to FIG. 7, the data signal supplied to the row select counter 6b-1 via the test control circuit 8b is load data D0, D1, D2, . . . . The control signal supplied to the row select counter 6b-1 via the test control circuit 8b includes a clear signal, a clock signal, an enable signal and a load signal. The load data D0, D1, D2, . . . are loaded into the row select counter 6b-1 in synchronism with the load signal while the enable signal is being supplied thereto. The row select counter 6b-1 starts the count operation in synchronism with the clock signal, and successively activates one of a plurality of output lines A0, A1, A2, connected to the row select decoder 6b-2. The row select decoder 6b-2 is composed of NAND gates 28 and inverters 29. The output lines A0, A1, A2, . . . are connected to each of the NAND gates 28. The row select counter 6b-1 is cleared in response to the clear signal.

Figure 8:
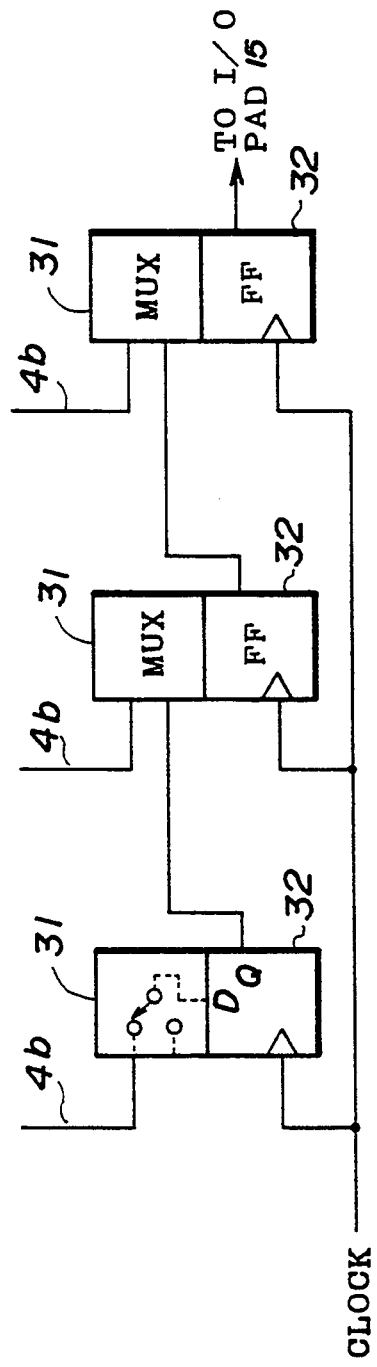
FIG. 8 is a block diagram of a sense circuit.

FIG. 8 is a block diagram of the sense circuit 7b, which is composed of multiplexers (MUX) 31 and flip-flops (FF) 32. A clock signal supplied from the test control circuit 8 is input to the flip-flops 32. Each of the multiplexers (selectors) 31 selects either data supplied from the flip-flop 32 of the previous stage or data read out via the corresponding sense line 4b. Data output by the flip-flop 32 of the final stage is output to the I/O pad 15.

The configurations shown in FIGS. 7 and 8 are disclosed in U.S. patent application Ser. No. 596,667 filed on Oct. 10, 1990, the disclosure of which is hereby incorporated by reference.

Figure 9:
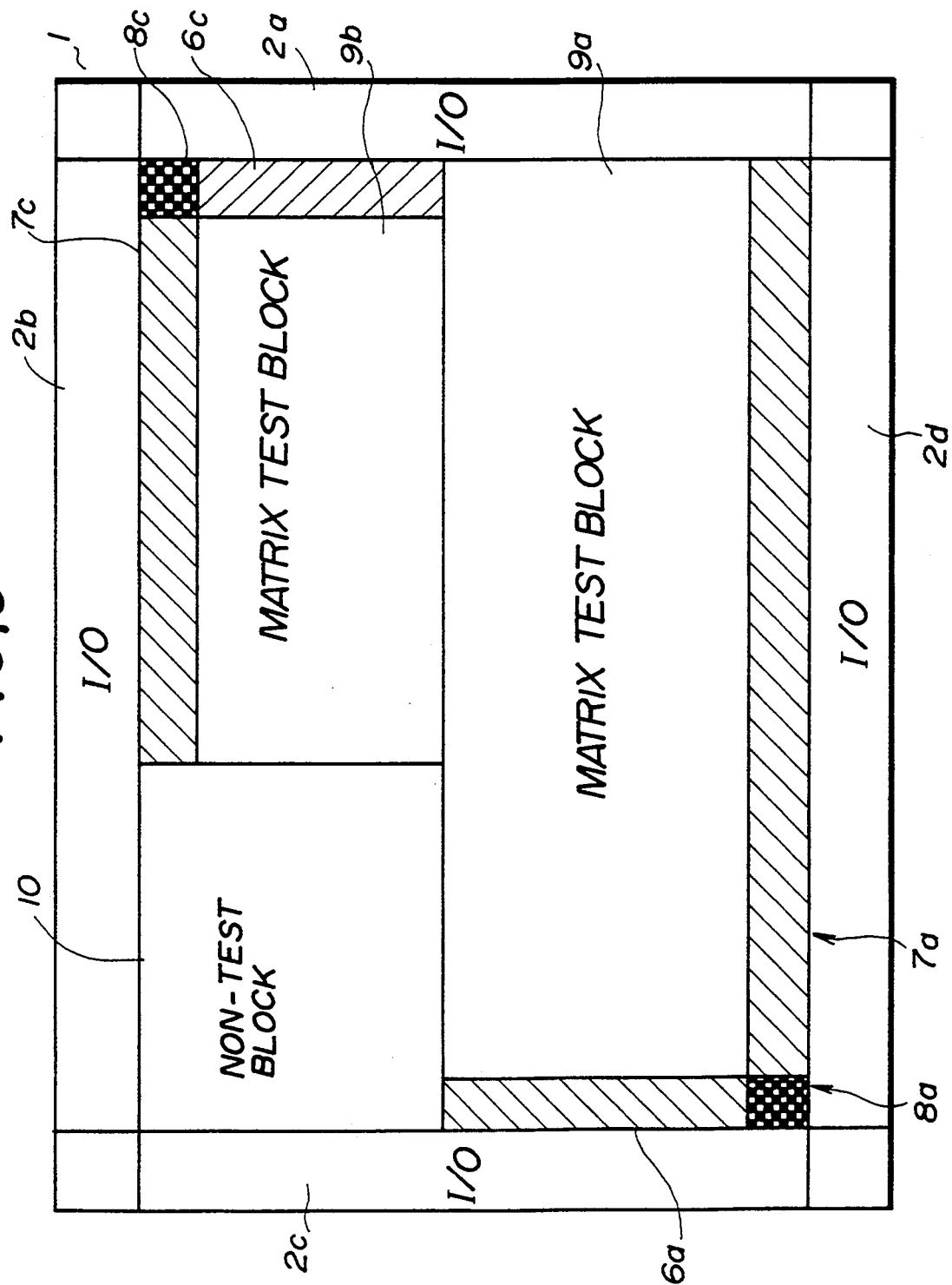
FIG. 9 is a diagram showing a variation of the arrangement shown in FIG.3.

FIG. 9 is a block diagram of a variation of the arrangement shown in FIG. 3. In FIG. 9, those parts which are the same as those shown in FIG. 3 are given the same reference numerals. The arrangement shown in FIG. 9 is different from that shown in FIG. 3 in that a probe line driver 6c, a sense circuit 7c and a test control circuit 8c are substituted for the probe line driver 6b, the sense circuit 7b and the test control circuit 8b. The probe line driver 6c is arranged along the I/O area 2a, and the sense circuit 7c is arranged along the I/O area 2b. The test control circuit 8c is adjacent to the probe line driver 6c and the sense circuit 7c. It should be noted that the test control circuit 8c is located in the vicinity of the chip corner. The position of the test control circuit 8c contributes to a reduction in the lengths of the interconnection lines between the I/O pads 14 (FIG. 6) and the test control circuit 8c, as compared with the configuration shown in FIG. 3.

Figure 10:
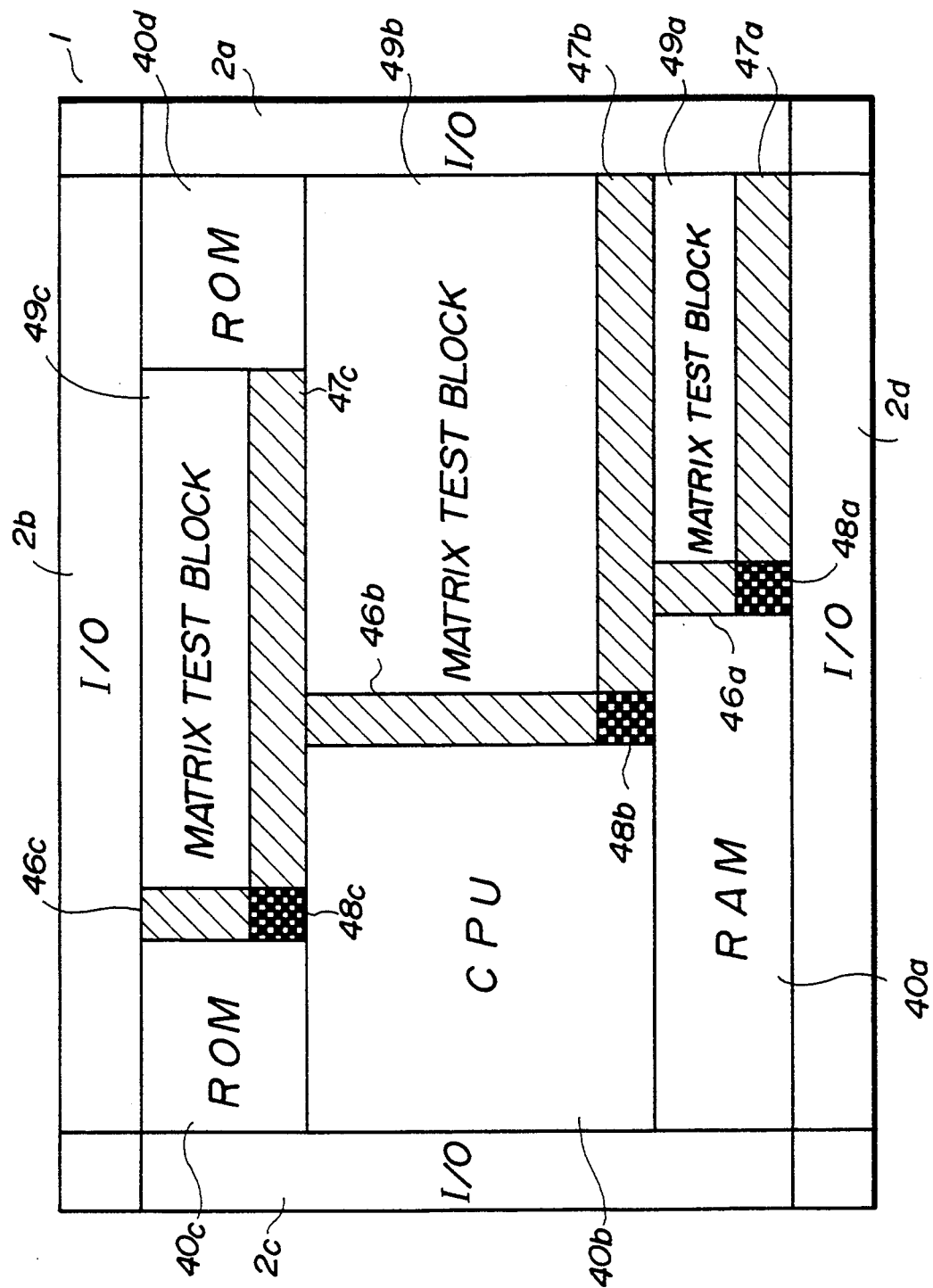
FIG. 10 is a diagram showing a circuit arrangement according to a second preferred embodiment of the present invention.

FIG. 10 is a block diagram showing a circuit arrangement according to a second embodiment of the present invention. As shown, three matrix test blocks 49a, 49b and 49c, and four non-test blocks 40a, 40b, 40c and 40d are arranged. The non-test block 40a and 40b are a RAM area and a CPU area, respectively, and the non-test block 40c and 40d are ROM areas. Probe line drivers 46a, 46b and 46c are provided along the left sides of the matrix test blocks 49a, 49b and 49c, respectively, and sense circuits 47a, 47b and 47c are provided along the lower sides of the matrix test blocks 49a, 49b and 49c, respectively. Test control circuits 48a, 48b and 48c are provided at the lower left corners of the matrix test blocks 49a, 49b and 49c, respectively.

Figure 11:
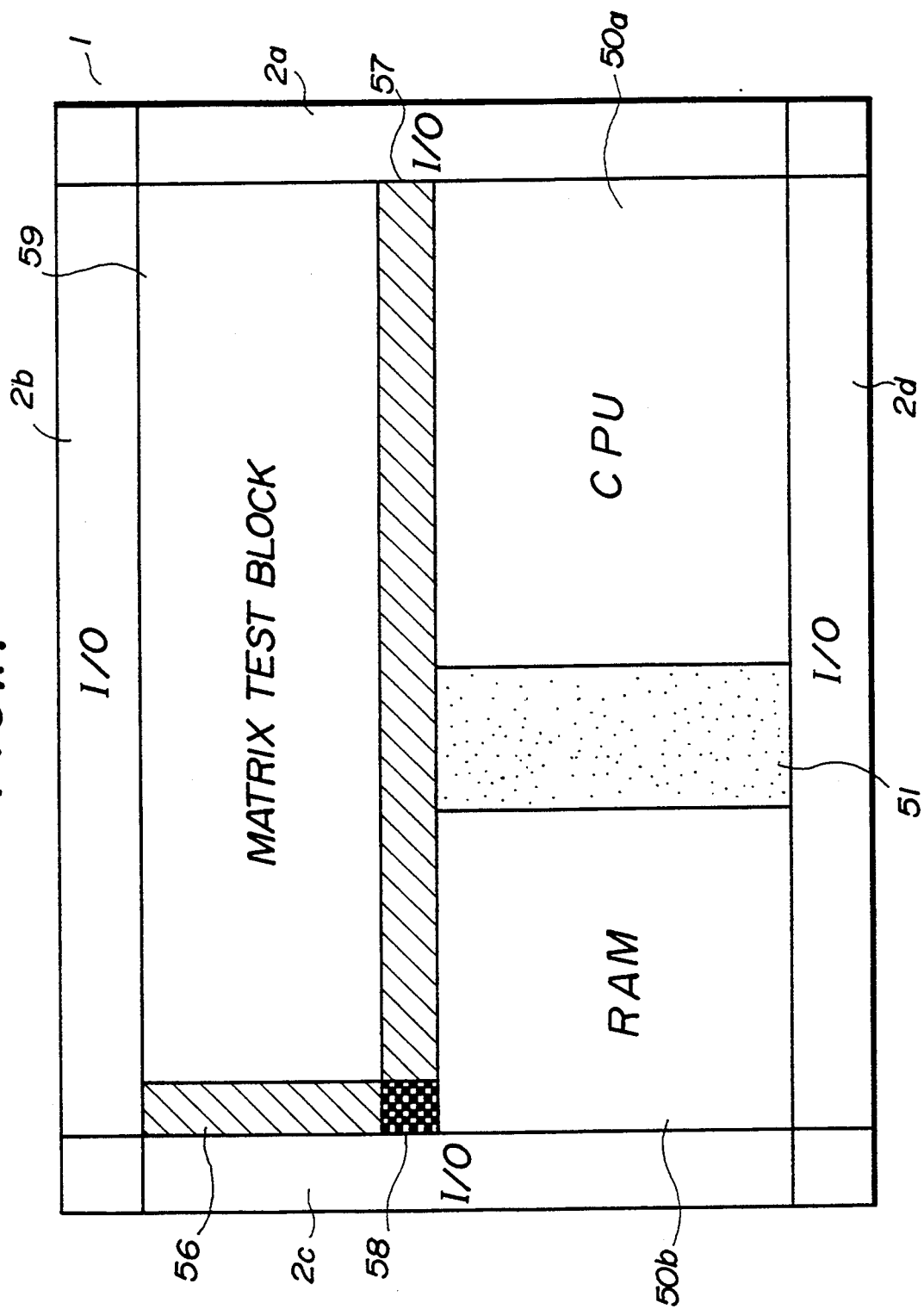
FIG. 11 is a diagram showing a circuit arrangement according to a third preferred embodiment of the present invention.

FIG. 11 is a block diagram of a circuit arrangement according to a third preferred embodiment of the present invention. The chip 1 shown in FIG. 11 has a matrix test block 59, two non-test blocks 50a (CPU) and 50b (RAM), and a logic block 51. The logic block 51 has a plurality of cells, as shown in FIG. 5. However, it is not required to test these cells, because the logic block 51 has a small number of cells or has a previously designed cell arrangement pattern which has been confirmed that it operates without any problem. Thus, the logic block 51 is handled in the same way as the CPU area 50a or the RAM area 50b and thus recognized as a non-test block. That is, no test circuits are provided for the logic block 51. A probe signal driver 56, a sense circuit 57 and a test control circuit 58 are provided for the matrix test block 59.

Figure 12:
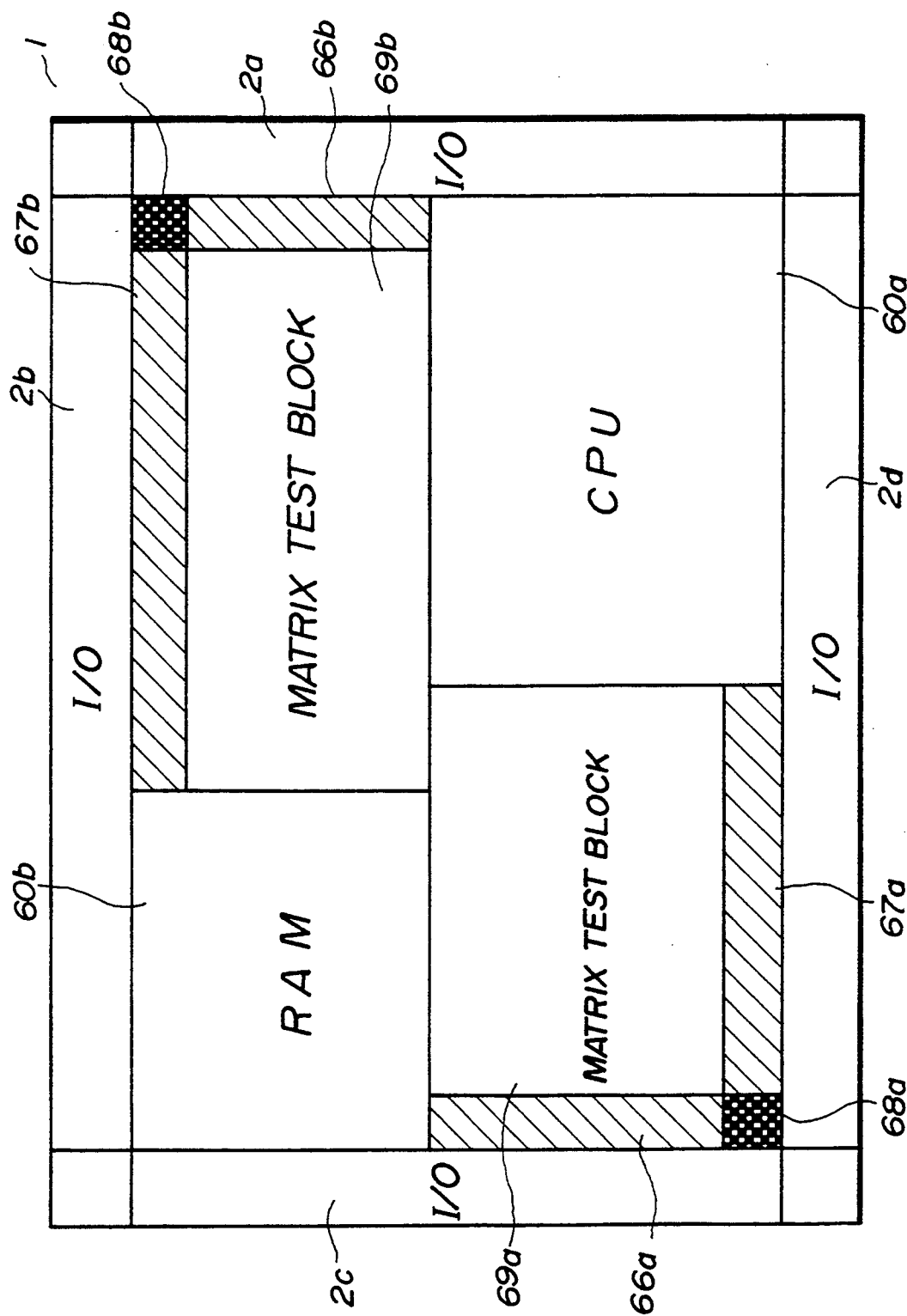
FIG. 12 is a diagram showing a variation of the arrangement shown in FIG.9.

FIG. 12 is a block diagram of a variation of the arrangement shown in FIG. 9. The chip 1 shown in FIG. 12 has two matrix test block 69a and 69b, and two non-test blocks 60a (CPU) and 60b (RAM). A probe line driver 66a, a sense circuit 67a and a test control circuit 68a are provided for the matrix test block 69a. Similarly, a probe line driver 66b, a sense circuit 67b and a test control circuit 68b are provided for the matrix test block 69b. It should be noted that the test control circuit 68a adjacent to the probe line driver 66a and the sense circuit 67a is located in a chip corner. Thus, it is possible to shorten the lengths of interconnection lines between the test control circuit 68a and the corresponding I/O pads. This holds true for the test control circuit 68b.

Figure 13:
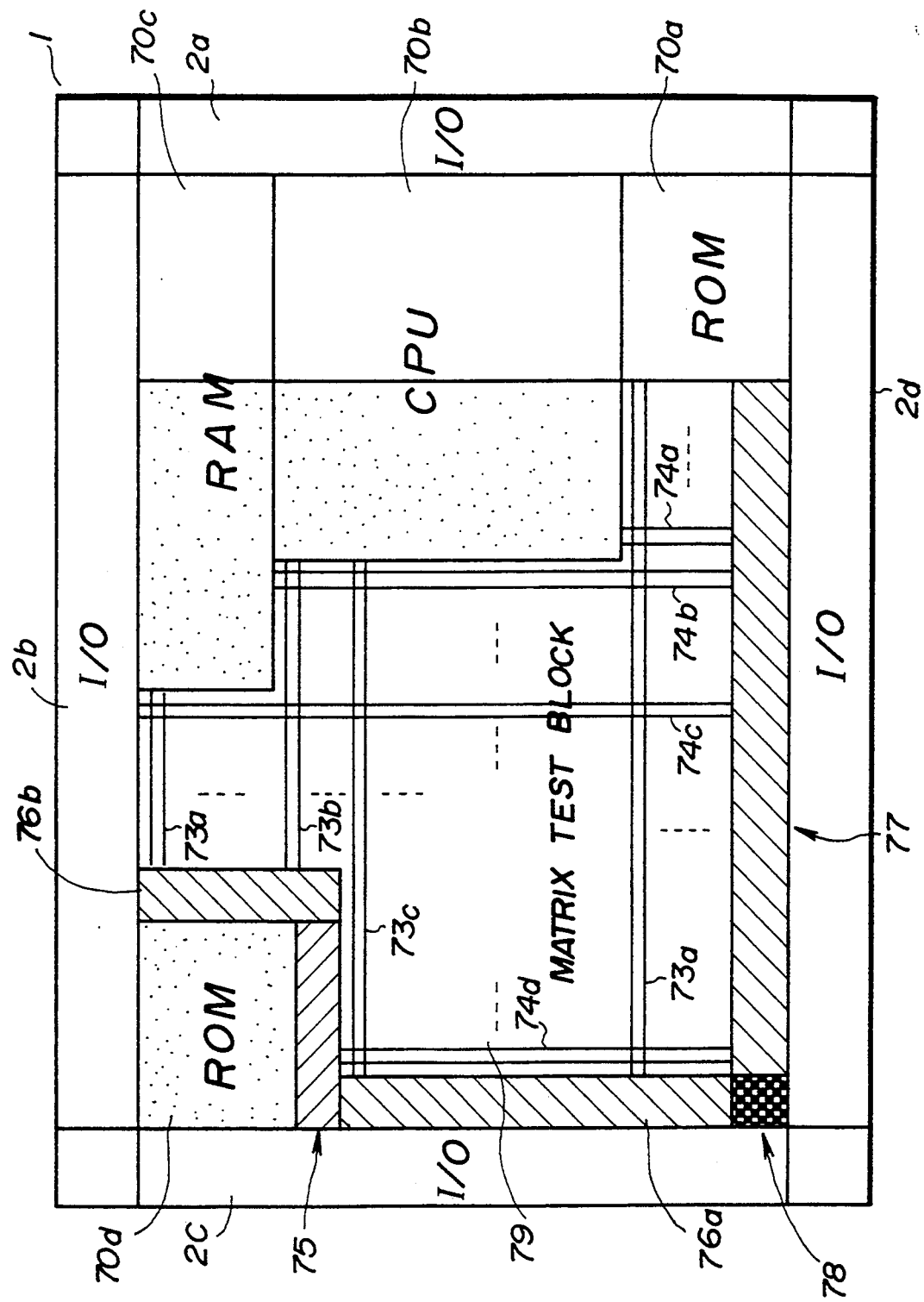
FIG. 13 is a diagram showing a circuit arrangement according to a fourth preferred embodiment of the present invention.

FIG. 13 is a diagram showing a circuit arrangement according to a fourth preferred embodiment of the present invention. The chip 1 shown in FIG. 13 has a non-rectangular matrix test block 79, and four non-test blocks 70a (ROM), 70b (CPU), 70c (RAM) and 70d (ROM). The fourth embodiment is not based on the procedure shown in FIG. 4. A sense circuit block 77 is located along the lower I/O area 2d. One end of the sense circuit block 77 is adjacent to the ROM area 70a, and the other end thereof is adjacent to a test control circuit 78. A probe line driver for the matrix test block 79 consists of two sub-blocks 76a and 76b. The sub-block 76a of the probe line driver is provided between the I/O area 2c and a lower left edge of the matrix test block 79, and the other sub-block 76b thereof is provided between the ROM area 70d and the upper left edge of the matrix test block 79. Enable signals (decoded signals) supplied from a row select counter provided in the sub-block 76a in the same way as shown in FIG. 7 pass through an area 75 and are supplied to the sub-block 76b.

Probe lines 73a and 73b extend from the sub-block 76b of the probe line driver, and probe lines 73c and 73d extend from the sub-block 76a thereof. The probe lines 73a end on the left side of the RAM area 70c, and the probe lines 73b end on the left side of the CPU area 70b. Similarly, the probe lines 73c end on the left side of the CPU area 70b, and the probe lines 73d end on the left side of the ROM area 70a. Sense lines 74a, 74b, 74c and 74d extend to the sense circuit 77. The sense lines 74a end on the lower side of the CPU area 70b, and the sense lines 74b end on the lower side of the RAM area 70c. The sense lines 74c end at an interface between the matrix test block 79 and the I/O area 2b. The sense lines 74d end at the lower side of the enable signal passing area 75.

Figure 14:
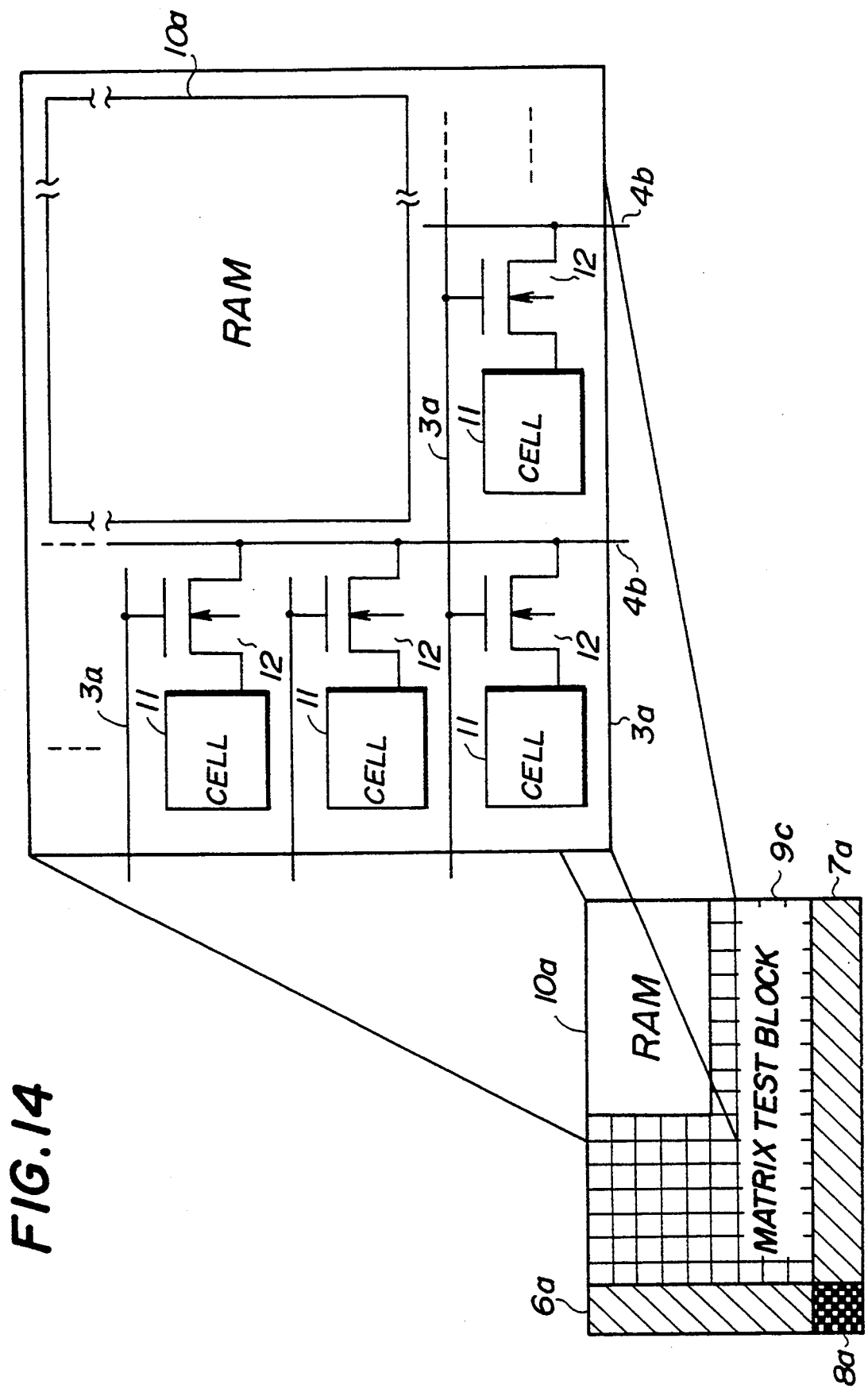
FIG. 14 is a diagram showing a circuit arrangement in which a non-test block is formed in a matrix test block.

FIG. 14 shows an arrangement in which a non-test block 10a forming a RAM is provided in a matrix test block 9c.

The present invention is not limited to the specifically disclosed embodiments, and variations and modifications may be made without departing from the scope of the present invention.

What is claimed is:

1. A circuit arrangement formed on an IC chip comprising:

a first type block having a plurality of cells arranged into rows and columns and a plurality of transistors respectively provided for said cells, each of said transistors having a first terminal coupled to a corresponding one of said cells, a second terminal and a gate terminal;

a second type block which is not required to be tested in a way identical to that for said first type block;

a probe line driver testing said cells in the first type block, said probe line driver being located along a first edge of said first type block, a plurality of probe lines extending from said probe line driver and running in said first type block, and said probe lines being arranged such as to not pass through said second type block, each of said probe lines being connected to the gate of a corresponding one of said transistors;

a sense circuit sensing data read out from said cells via a plurality of sense lines running in said first type block, said sense lines being arranged such as to not pass through said second type block, each of said sense lines being connected to the second terminal of a corresponding one of said transistors, said sense circuit being located along a second edge of said first type block substantially perpendicular to said first edge of the first type block; and a test control circuit controlling said probe line driver and said sense circuit so that data are successively read out from said cells and transferred to said sense lines via said transistors, said test control circuit being adjacent to said probe line drive and said sense circuit.

2. A circuit arrangement as claimed in claim 1, wherein said probe line driver is located between said first type block and said second type block.

3. A circuit arrangement as claimed in claim 1, wherein said probe line driver is located along a peripheral area of said IC chip.

4. A circuit arrangement as claimed in claim 1, wherein said sense circuit is located between said first type block and said second type block.

5. A circuit arrangement as claimed in claim 1, wherein said sense circuit is located along a peripheral area of said IC chip.

6. A circuit arrangement as claimed in claim 1, wherein said test control circuit is located at a corner portion of said IC chip.

7. A circuit arrangement as claimed in claim 1, wherein said test control circuit is located at a peripheral portion of said IC chip.

8. A circuit arrangement as claimed in claim 1, wherein said test control circuit is located at a corner portion of said first type block.

9. A circuit arrangement as claimed in claim 1, wherein:
said probe line driver comprises a first probe line driver and a second probe line driver spaced apart from said first probe line driver; and
said circuit arrangement comprises a line area which is formed along said second type block and which has a line electrically connecting said first probe line driver with said second probe line driver.

10. A circuit arrangement as claimed in claim 9, wherein said line electrically connecting said first probe line driver with said second probe line driver runs substantially parallel to a direction in which said probe lines run.

11. A circuit arrangement formed on an IC chip comprising:
a plurality of first type blocks, each having a plurality of cells arranged into rows and columns and a plurality of transistors respectively provided for said cells, each of said transistors having a first terminal coupled to a corresponding one of said cells, a second terminal and a gate terminal;
a second type block which is not required to be tested in a way identical to that for said first type blocks;
a plurality of probe line drivers respectively provided for said first type blocks, each of said probe line drivers testing said cells in a corresponding one of the first type blocks, each of said probe line drivers being located along a first edge of the corresponding one of the first type blocks, a plurality of probe lines extending from said probe line driver and running in said corresponding one of the first type blocks, said probe lines being arranged such as not to pass through said second type block, each of said probe lines being connected to the gate of a corresponding one of said transistors;
a plurality of sense circuits respectively provided for said first type blocks, said sense circuit sensing data read out from said cells via a plurality of sense lines running in said corresponding one of the first type blocks, said sense lines being arranged such as to not pass through said second type block, each of said sense lines being connected to the second terminal of a corresponding one of said transistors, each of said sense circuits being located along a second edge of the corresponding one of the first type blocks substantially perpendicular to said first edge thereof; and
a plurality of test control circuits respectively provided for said first type blocks, said test control circuits controlling said plurality of probe line drivers and sense circuits so that data are successively read out from said cells and transferred to said sense lines via said transistors, each of said test control circuits being adjacent to a corresponding one of said probe line drivers and a corresponding one of said sense circuits.

12. A circuit arrangement as claimed in claim 11, wherein:
said probe lines extending from the probe line drivers run in a first direction; and
said sense lines extending from the sense circuits run in a second direction substantial perpendicular to said first direction.

13. A circuit arrangement as claimed in claim 11, wherein:
said probe line drivers are arranged in a first direction; and
said sense circuits are arranged in a second direction substantially perpendicular to said first direction.

14. A circuit arrangement as claimed in claim 11, wherein at least one of said probe line drivers is located between said corresponding one of the first type block and said second type block.

15. A circuit arrangement as claimed in claim 11, wherein at least one of said sense circuits is located between said corresponding one of the first type block and said second type block.

16. A circuit arrangement as claimed in claim 11, wherein at least one of said test control circuits is not adjacent to a peripheral area of said chip but spaced apart therefrom.

17. A circuit arrangement as claimed in claim 11, wherein said probe lines extending from a first one of said probe line drivers are different from those extending from a second one of said probe line drivers.

18. A circuit arrangement as claimed in claim 11, wherein said sense lines extending from a first one of said sense circuits are different from those extending from a second one of said sense circuits.

19. A circuit arrangement as claimed in claim 11, wherein:
one of said probe line drivers comprises a first probe line driver and a second probe line driver spaced apart from said first probe line driver; and
said circuit arrangement comprises a line area which is formed along said second type block and which has a line electrically connecting said first probe line driver with said second probe line driver.

20. A circuit arrangement as claimed in claim 19, wherein said line electrically connecting said first probe line driver with said second probe line driver runs substantially parallel to a direction in which said probe lines run.

21. A semiconductor integrated circuit device comprising:
a chip;
a non-test block, which is not required to be tested, formed on said chip;

a plurality of circuit blocks formed on said chip, each of said circuit blocks comprising a plurality of circuit nodes, a plurality of sense lines coupled to said circuit nodes via a plurality of switches, and a plurality of probe lines crossing said sense lines and controlling said switches, said probe lines and sense lines arranged such as to not pass through said non-test block; and a plurality of test control circuits formed on said chip, each being provided for a corresponding one of said circuit blocks and arranged along two neighboring edges of said corresponding one of said circuit blocks, each of said test control circuits testing said circuit nodes of said corresponding one of said circuit blocks, each of said test control circuits comprising a sense circuit selectively selecting said sense lines of said corresponding one of said circuit blocks, and a drive circuit selecting said probe lines of said corresponding one of said circuit blocks.

22. A semiconductor integrated circuit device as claimed in claim 21, wherein said test control circuits are arranged along edges of said chip.

23. A semiconductor integrated circuit device as claimed in claim 21, wherein:

said plurality of current blocks include a first block having a substantially rectangular area on said chip and a second block having a substantially rectangular area on said chip;

said second block has a size smaller than that of said first block; and circuit blocks other than said first and second blocks are arranged close to said first and second blocks.

24. A semiconductor integrated circuit device as claimed in claim 23, wherein:

said chip is a master-slice integrated circuit chip;

said circuit blocks comprises basic cells arranged so that said basic cells form different logic circuits in different interconnecting ways; and said semiconductor integrated circuit device comprises a special block having a fixed circuit pattern.

25. A semiconductor integrated circuit device as claimed in claim 24, wherein said special block comprises a memory circuit.

26. A semiconductor integrated circuit device as claimed in claim 23, wherein:

said chip is a standard cell type chip;

said circuit blocks have standard cell structures; and said semiconductor integrated circuit device comprises a special block having a specifically designed circuit pattern.

27. A circuit arrangement formed on an IC chip comprising:

a first type block having a plurality of cells arranged into rows and columns and a plurality of switches respectively provided for said cells;

a second type block which is not required to be tested in a way identical to that for said first type block;

a probe line driver testing said cells in the first type block, said probe line driver to make said switches connect a plurality of probe lines extending from said probe line driver, said probe lines being arranged such as to not pass through said second type block;

a sense circuit sensing data read out from said cells via a plurality of sense lines running in said first type block, said sense lines being arranged such as to not run through said second type block; and a test control circuit controlling said probe line driver and said sense circuit so that data are successively read out from said cells and transferred to said sense lines via said transistors, said test control circuit being adjacent to said probe line driver and said sense circuit.

28. A circuit arrangement as claimed in claim 27, wherein said switches comprise transistors, each having a first terminal coupled to a corresponding one of said cells, a second terminal coupled to a corresponding one of said sense lines, and a gate coupled to a corresponding one of said probe lines.

29. A method for arranging circuit blocks on a chip, said method comprising the steps of:

categorizing the circuit blocks arranged on the chip into a first group required to test the circuit blocks by a matrix probing test and a second group which is not required to test the circuit blocks by the matrix probing test;

dividing each circuit blocks in said first group into sub-blocks, each having a substantially rectangular area on said chip;

arranging a plurality of sense lines and probe lines in each of said sub-blocks; and arranging a test control circuit along two edges of each of said sub-blocks, said test control circuit being connected to said sense lines and probe lines and testing a corresponding one of said sub-blocks by the matrix probing test.

30. A method for arranging circuit blocks on a chip of a semiconductor integrated circuit device, said circuit blocks being formed on said chip, each of said circuit blocks including a plurality of circuit blocks including a plurality of circuit nodes, a plurality of sense lines coupled to said circuit nodes via a plurality of switches, and a plurality of probe lines crossing said sense lines and controlling said switches, said semiconductor integrated circuit device having a plurality of test control circuits, each being provided for a corresponding one of said circuit blocks and arranged along two neighboring edges of said corresponding one of said circuit blocks, each of said test control circuits testing said circuit nodes of said corresponding one of said circuit blocks, each of said test control circuits including a sense circuit selectively selecting said sense lines of said corresponding one of said circuit blocks, and a drive circuit selecting said probe lines of said corresponding one of said circuit blocks, said method comprising the steps of:

(a) arranging a special block in a circuit formation area on said chip, said special block being not required to be tested by a matrix probe test;

(b) arranging a first area for said circuit blocks in a part of said circuit formation area other than a second area for said special block; and (c) arranging said plurality of probe lines and said plurality sense lines to not pass through said special block.

31. A method as claimed in claim 30, wherein said step (b) comprises the steps of:

(b-1) dividing said first area into a plurality of sub-blocks, each having a substantially rectangular area; and (b-2) arranging said circuit blocks in at least one of said sub-blocks.

32. A method as claimed in claim 31, wherein said step (b-2) comprises the step of arranging said driver circuit along a first edge of said at least one of said sub-blocks, said sense circuit along a second edge thereof adjacent to said first edge, and said cells within said at least one of said sub-blocks.

* * * * *